(12) United States Patent
Kirchmeier et al.

(10) Patent No.: US 8,866,400 B2
(45) Date of Patent: Oct. 21, 2014

(54) PLASMA SUPPLY DEVICE

(71) Applicant: HUETTINGER Elektronik GmbH + Co. KG, Freiburg (DE)

(72) Inventors: Thomas Kirchmeier, Teningen (DE); Michael Glueck, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 13/848,319

(22) Filed: Mar. 21, 2013

(65) Prior Publication Data

US 2013/0214680 A1 Aug. 22, 2013

Related U.S. Application Data

(63) Continuation of application No. 12/685,142, filed on Jan. 11, 2010, now Pat. No. 8,436,543, which is a continuation-in-part of application No. PCT/EP2008/005313, filed on Jun. 30, 2008, which is a continuation-in-part of application No. PCT/DE2007/001775, filed on Oct. 4, 2007.

(60) Provisional application No. 60/951,392, filed on Jul. 23, 2007.

(51) Int. Cl.
*H05B 37/02* (2006.01)

(52) U.S. Cl.
USPC ....... 315/224; 315/283; 315/326; 204/298.08

(58) Field of Classification Search
USPC ............... 315/224, 226, 283, 326; 204/230.2, 204/230.8, 298.08
See application file for complete search history.

(56) References Cited

U.S. PATENT DOCUMENTS

| 3,820,008 A | 6/1974 | Guarnaschelli |
| 4,053,848 A | 10/1977 | Kleische |
| 4,215,392 A | 7/1980 | Rhoads |
| 4,490,684 A | 12/1984 | Epsom et al. |

(Continued)

FOREIGN PATENT DOCUMENTS

| DE | 10262286 B4 | 3/2009 |
| EP | 0073059 | 2/1983 |

(Continued)

OTHER PUBLICATIONS

De Vries et al., "Solid state class DE RF power source," Proc. IEEE International Symposium on Industrial Electronics (ISIE'98), vol. 2, pp. 524-529, Pretoria, South Africa, Jul. 1998.

(Continued)

*Primary Examiner* — Thuy Vinh Tran
(74) *Attorney, Agent, or Firm* — Fish & Richardson P.C.

(57) ABSTRACT

A plasma supply device generates an output power greater than 500 W at an essentially constant basic frequency greater than 3 MHz and powers a plasma process to which is supplied the generated output power, and from which reflected power is returned to the plasma supply device. The plasma supply device includes at least one inverter connected to a DC power supply, which inverter has at least one switching element, and an output network, wherein the at least one output network includes at least one inductance that has at least one magnetic field strengthening element that is a Perminvar ferrite.

20 Claims, 5 Drawing Sheets

(56) References Cited

U.S. PATENT DOCUMENTS

| | | |
|---|---|---|
| 4,656,434 A | 4/1987 | Selin |
| 4,701,716 A | 10/1987 | Poole |
| 4,758,941 A | 7/1988 | Felton et al. |
| 4,860,189 A | 8/1989 | Hitchcock |
| 4,910,452 A | 3/1990 | Dickens et al. |
| 4,921,357 A | 5/1990 | Karube et al. |
| 4,980,810 A | 12/1990 | McClanahan |
| 5,195,045 A | 3/1993 | Keane et al. |
| 5,222,246 A | 6/1993 | Wolkstein |
| 5,225,687 A | 7/1993 | Jason |
| 5,363,020 A | 11/1994 | Chen et al. |
| 5,382,344 A | 1/1995 | Hosokawa et al. |
| 5,394,061 A | 2/1995 | Fujii |
| 5,424,691 A | 6/1995 | Sadinsky |
| 5,434,527 A | 7/1995 | Antone |
| 5,435,881 A | 7/1995 | Ogle |
| 5,438,498 A | 8/1995 | Ingemi |
| 5,523,955 A | 6/1996 | Heckman |
| 5,563,775 A | 10/1996 | Kammiller |
| 5,574,410 A | 11/1996 | Collins et al. |
| 5,610,452 A | 3/1997 | Shimer et al. |
| 5,635,762 A | 6/1997 | Gamand |
| 5,810,963 A | 9/1998 | Tomioka |
| 5,875,103 A | 2/1999 | Bhagwat et al. |
| 5,944,942 A | 8/1999 | Ogle |
| 6,038,142 A | 3/2000 | Fraidlin et al. |
| 6,084,787 A | 7/2000 | Nyberg et al. |
| 6,130,831 A | 10/2000 | Matsunaga |
| 6,229,718 B1 | 5/2001 | Nilssen |
| 6,246,599 B1 | 6/2001 | Jang et al. |
| 6,297,696 B1 | 10/2001 | Abdollahian et al. |
| 6,313,584 B1 | 11/2001 | Johnson et al. |
| 6,344,768 B1 | 2/2002 | Daun-Lindberg et al. |
| 6,365,868 B1 | 4/2002 | Borowy et al. |
| 6,703,080 B2 | 3/2004 | Reyzelman et al. |
| 6,704,203 B2 | 3/2004 | Chapuis et al. |
| 6,760,234 B2 | 7/2004 | Yuzurihara et al. |
| 6,777,881 B2 | 8/2004 | Yuzurihara et al. |
| 6,791,851 B2 | 9/2004 | Brkovic |
| 6,885,567 B2 * | 4/2005 | Lincoln et al. ............ 363/56.01 |
| 6,909,617 B1 | 6/2005 | Mirskiy |
| 6,992,902 B2 | 1/2006 | Jang et al. |
| 6,996,892 B1 | 2/2006 | Dening et al. |
| 7,138,861 B2 | 11/2006 | Sundström et al. |
| 7,161,336 B2 | 1/2007 | Sakai et al. |
| 7,161,818 B2 | 1/2007 | Kirchmeier et al. |
| 7,244,343 B2 | 7/2007 | Watanabe et al. |
| 7,259,623 B2 | 8/2007 | Coleman |
| 7,312,584 B2 | 12/2007 | Tamita et al. |
| 7,333,348 B2 | 2/2008 | Horiuchi et al. |
| 7,353,771 B2 | 4/2008 | Millner et al. |
| 7,403,400 B2 | 7/2008 | Stanley |
| 7,452,443 B2 | 11/2008 | Glück et al. |
| 7,616,462 B2 | 11/2009 | Millner et al. |
| 7,755,300 B2 | 7/2010 | Kishinevsky et al. |
| 7,796,005 B2 | 9/2010 | Blankenship et al. |
| 7,872,523 B2 | 1/2011 | Sivakumar et al. |
| 7,884,590 B2 | 2/2011 | Liu |
| 8,421,377 B2 | 4/2013 | Kirchmeier et al. |
| 2003/0215373 A1 | 11/2003 | Reyzelman et al. |
| 2004/0031566 A1 | 2/2004 | Takahashi et al. |
| 2004/0105288 A1 | 6/2004 | Watanabe et al. |
| 2004/0114399 A1 | 6/2004 | Lincoln et al. |
| 2005/0088231 A1 | 4/2005 | Ziegler |
| 2005/0088855 A1 | 4/2005 | Kirchmeier et al. |
| 2005/0255809 A1 | 11/2005 | Glueck |
| 2006/0158911 A1 | 7/2006 | Lincoln et al. |
| 2006/0191880 A1 | 8/2006 | Kwon et al. |
| 2006/0196426 A1 | 9/2006 | Gluck et al. |
| 2006/0252283 A1 | 11/2006 | Takeda et al. |
| 2007/0121267 A1 | 5/2007 | Kotani et al. |
| 2007/0145900 A1 | 6/2007 | Kirchmeier et al. |
| 2009/0153127 A1 | 6/2009 | Chen |

FOREIGN PATENT DOCUMENTS

| | | |
|---|---|---|
| EP | 1272014 | 1/2003 |
| EP | 1783904 | 10/2005 |
| EP | 1701376 | 9/2006 |
| JP | 55082967 | 6/1980 |
| JP | 9120910 A | 5/1997 |
| JP | 10214689 A | 8/1998 |
| JP | 10215160 A | 8/1998 |
| JP | 2001128458 A | 5/2001 |
| JP | 2001185443 A | 7/2001 |
| JP | 2002237419 A | 8/2002 |
| JP | 2005086622 A | 3/2005 |
| JP | 2006165438 A | 6/2006 |
| JP | 2007151331 A | 6/2007 |
| WO | 9749267 | 12/1997 |
| WO | 9857406 | 12/1998 |
| WO | 2005094138 | 6/2005 |

OTHER PUBLICATIONS

Walker et al., "An Isolated MOSFET Gate Driver", Australasian Universities Power Engineering Conference, AUPEC'96, 1996, vol. 1 Melbourne, pp. 175-180.

* cited by examiner

PLASMA SUPPLY DEVICE

CROSS REFERENCE TO RELATED APPLICATIONS

This application is a continuation of U.S. application Ser. No. 12/685,142, filed Jan. 11, 2010, which is a continuation-in-part of PCT International Application No. PCT/EP2008/005313, filed Jun. 30, 2008, incorporated herein by reference, which claims priority under 35 U.S.C. §119(e) to U.S. Patent No. 60/951,392, filed on Jul. 23, 2007 and under 35 U.S.C. §119(a) to PCT/DE2007/001775, filed on Oct. 4, 2007, both of which are hereby incorporated by reference in their entirety.

TECHNICAL FIELD

The invention relates to a plasma supply device for generating an output power greater than about 500 W at an essentially constant basic frequency greater than about 3 MHz for a plasma process.

BACKGROUND

A plasma supply device is a plasma power supply that supplies plasma processes with power. The plasma supply device operates at a basic frequency that, when used as a plasma power supply, should only deviate slightly from a theoretical value. Typical basic frequencies are, for example, 3.39 MHz, 13.56 MHz, 27 MHz, 40 MHz, and 62 MHz. The inverter, which has at least one switching element, generates from the DC signal of a DC power supply an alternating signal that changes its sign periodically at the rate of the basic frequency. For this purpose, a switching element is switched backwards and forwards between a conducting and a non-conducting state within the cycle of the basic frequency. An output network generates from the alternating signal generated by the inverter a sinusoidal output signal at essentially the predetermined basic frequency.

A plasma is a special aggregate condition that is produced from a gas. Every gas consists in principle of atoms and/or molecules. In the case of a plasma, the gas is largely ionized, which means that the atoms and/or molecules are split into positive and negative charge carriers, i.e., into ions and electrons, due to the supply of energy. A plasma is suitable for machining workpieces because the electrically charged particles are highly reactive chemically and can also be influenced by electrical fields. The charged particles can be accelerated by means of an electrical field on a workpiece, where they can release individual atoms from the workpiece on collision. The released atoms can be removed by gas flow (etching) or coated on other workpieces (production of thin films). A plasma can be used to machine extremely thin layers, for example, in the region of few atom layers. Typical applications for plasma machining are semiconductor technology (coating, etching, etc.), flat screens (similar to semiconductor technology), solar cells (similar to semiconductor technology), architectural glass coating (heat protection, dazzling protection, etc.), storage media (CD, DVD, hard discs), decorative coatings (coloured glasses, etc.), and tool hardening. These applications impose high demands in terms of accuracy and process stability.

To generate a plasma from a gas, energy is supplied to the gas. Energy can be generated in different ways, for example, with light, heat, or electrical energy. If energy is generated using electrical energy, then the plasma is ignited with the electrical energy. A plasma for machining workpieces is typically ignited in a plasma chamber, for which purpose an inert gas, e.g., argon, is generally conducted into the plasma chamber at low pressure. The gas is exposed to an electrical field that is produced by electrodes and/or antennae.

A plasma is generated or is ignited when several conditions are met. A small number of free charge carriers must be present, and in most cases, use is made of the free electrons that are always present to a small extent. The free charge carriers are accelerated so much by the electrical field that they release additional electrons when colliding with atoms or molecules of the inert gas, thus producing positively charged ions and even more negatively charged particles (electrons). The additional free charge carriers are again accelerated and on collision produce additional ions and electrons. An avalanche effect is created. The natural recombination counteracts the constant generation of ions and electrons, i.e., electrons are attracted by ions and recombine to form electrically neutral atoms and/or molecules. Therefore energy is constantly supplied to an ignited plasma in order to maintain it.

Plasma power supplies are used for generating or igniting and maintaining a plasma, but can also be used for exciting gas lasers. Plasma power supplies have the smaller dimensions to ensure that they can be arranged in the application close to the plasma discharges. They should have the highest possible repeat accuracy and operate precisely, with the smallest possible losses to achieve high efficiency. Further requirements are minimal production costs and high maintenance friendliness. If possible, plasma power supplies are provided without mechanically driven components, and fans can be undesirable because of their limited life and the risk of contamination. Furthermore, plasma power supplies should be as reliable as possible, should not overheat, and should have a long operating time.

Due to the high dynamics and often chaotic conditions in plasma processes, a plasma power supply is subject to much more stringent requirements than any other power supply. An un-ignited gas, which has only a very small number of free charge carriers, has an almost infinitely high impedance. Because of its large number of free charge carriers, a plasma has a relatively low impedance. When the plasma is ignited, therefore, there is a rapid impedance change. Another characteristic of an ignited plasma is that the impedance can vary very quickly and often unpredictably, and the impedance is then said to be dynamic. The impedance of the plasma is still non-linear to a great extent, which means that a variation in the voltage on the plasma does not correlate to a similar variation in current. For example, the current can increase much more quickly as the voltage increases due, for example, to an avalanche effect, or the current can also decrease as the voltage increases at so-called negative impedance.

If a power supply discharges a power in the load direction, such as a plasma load, which flows at finite speed towards the load, but cannot be absorbed there because the same current is not set when the voltage is present on the load due to the different impedance, only that proportion of the power that is calculated from voltage and current to obtain the load is absorbed, the remaining proportion of the power being reflected. In fact this also takes place in power supplies with low frequencies, and also in direct current, but only in the latter does it take place so quickly that the voltage at the output of the power supply has in practice not yet changed by the time the reflected energy returns. To the observer, therefore, this happens simultaneously. However, in high frequency technology with frequencies above around 1 MHz, the voltage and current at the output of the power supply have generally already changed by the time the reflected power returns.

The reflected power has a considerable influence on the power supplies in high frequency technology. Reflected power can destabilize power supplies and prevent the supply systems from operating according to the regulations. Because of incorrect adaptations, the reflected power only has proportions of the basic frequency at constant impedances. The reflected power cannot be blocked or absorbed with filters because filters cannot distinguish between forward (to the load) running waves and backwards (from the load) running waves, and would consequently also block or absorb the forward running waves. In order to reduce or minimize the reflected power, so-called impedance adapter elements or networks are used. Impedance adapter elements or networks can be produced using high frequency technology by combinations of inductances, capacitances, and resistances, with resistances not being absolutely necessary. However, if the load is not a constant impedance, but is a dynamic and non-linear impedance, at least two additional problematic phenomena can arise. First, energies can be generated by the non-linear, dynamic impedance at frequencies that differ from the basic frequency, and proportions of these frequencies are conducted in the direction of the power supply. These are blocked or absorbed by filters. Second, the impedance adapter elements cannot follow the fast dynamic impedance variations sufficiently quickly, thus giving rise increasingly to reflections at the basic frequency, which reflections are conducted by the dynamic impedance to the power supply.

Unlike in other power supply systems, plasma power supplies need to be able to be loaded with any incorrect termination, from no load through short-circuit, from infinitely high capacitive load to infinitely high inductive load. At any point on the Smith graph, a plasma power supply must be able to supply power for at least a short period of time and must not suffer permanent damage in doing so. This is linked to the high dynamics and the often chaotic conditions in a plasma process. In addition, frequencies within a wide range and differing from the basic frequency can occur, and these frequencies should be prevented from causing permanent damage to the plasma power supply. The detection and rapid disconnection of an incorrect terminal are allowed in this case, but the plasma power supply should not be damaged if at all possible.

SUMMARY

In some aspects, a plasma supply device generates an output power greater than 500 W at an essentially constant basic frequency of greater than 3 MHz and powers a plasma process, to which the generated output power is supplied, and from which reflected power is returned to the plasma supply device. The plasma supply device includes at least one inverter connected to a DC power supply, where the at least one inverter has at least one switching element, and at least one output network electrically coupled to the at least one inverter. The at least one output network includes at least one inductance that has at least one magnetic field strengthening element that is a Perminvar ferrite.

Implementations can include one or more of the following features. For example, the at least one output network can be arranged on a printed circuit board and the inductance can be formed using a planar technology.

The plasma supply device include at least one input connection arranged on the printed circuit board for connection to the at least one inverter. The at least one inverter can be arranged on the printed circuit board.

At least one component of the plasma supply device can be designed so that it at least partially absorbs power reflected from the plasma process at the basic frequency.

The printed circuit board can be produced from glass fiber reinforced epoxy resin. The printed circuit board can be made of FR4 or FR5 material. The printed circuit board can be of multi-layer design. The printed circuit board can have four layers, and a turn of the at least one output transformer can be formed in each of the four layers of the printed circuit board.

The at least one inductance can be part of at least one output transformer having a primary-side winding and a secondary-side winding.

The at least one output transformer can be planar.

The primary-side winding and the secondary-side winding of the at least one output transformer can each have two turns.

The at least one output network can include at least one set of first inductances arranged between the input connection and the primary-side winding.

The at least one inductance can have a value greater than 50 nH and a quality factor better than 200.

The distance between at least two layers of the printed circuit board can be greater than a distance required for electric strength of the two layers.

The plasma supply device can include capacitances formed between turns of the secondary-side winding of the at least one output transformer. An LC filter can be formed from the capacitances between the turns of the secondary-side winding of the at least one output transformer and from the inductance of the secondary-side winding of the at least one output transformer.

The plasma supply device can include another capacitance formed between the primary-side winding and the secondary-side winding of the at least one output transformer, where the other capacitance is a component of the LC filter.

The at least one output network can include at least one impedance adapter element between the secondary-side winding and at least one output connection for the connection of a load, where the at least one impedance adapter element can include one or more of a second inductance and a capacitor.

The capacitor can have a planar technology. The capacitor can be a surface mount device.

The plasma supply device can include through contacts formed on the printed circuit board for connecting conductor paths arranged in the layers.

The at least one magnetic field strengthening element can be assigned to or associated with one or more windings of the at least one output transformer.

The at least one recess can be formed on the printed circuit board for receiving the at least one magnetic field strengthening element.

The plasma supply device can include a cooling plate connected to the printed circuit board. The printed circuit board can be separated from the cooling plate. The printed circuit board can be separated from the cooling plate by a distance of between about 5 mm to about 20 mm.

The magnetic field strengthening element, in some implementations, encloses the inductance and/or a winding of an output transformer, and the printed circuit board is separated from the cooling plate by a distance that is greater than or equal to a thickness of the magnetic field strengthening element.

The plasma supply device can include one or more heat transmission elements between the printed circuit board and the cooling plate. The heat transmission elements can be in the vicinity of the at least one output transformer, and conductor paths of the printed circuit board extends to the heat transmission elements through the magnetic field strengthening element assigned to or associated with the at least one output transformer.

The plasma supply device can include an earth connection on the printed circuit board. The earth connection can be a bore through the printed circuit board having an electrical contact.

The plasma supply device can include two output networks, each output network including at least a set of first inductances, an output transformer, and an impedance adapter element. The power output of the two output networks can be combined to form a single power output with a coupler.

At least two output networks can have output powers that are combined to one total power. The output networks can be connected in parallel to at least one common inverter. The output networks can be connected to separate inverters.

The combination of the output powers can be achieved by means of at least one coupler. The at least one coupler can be on the printed circuit board and can be designed at least partially in a planar technology. The at least one coupler can include at least one inductance that has at least one magnetic field strengthening element that is a Perminvar ferrite.

The at least one magnetic field strengthening element of the coupler can be made of the same material and/or the same shape as the magnetic field strengthening element of the inductance of the output network.

The plasma supply device can operate at an essentially constant basic frequency of less than 30 MHz. In some examples, the plasma supply device generates an output power greater than 500 W at an essentially constant basic frequency in the range of 3 MHz to 30 MHz.

In another general aspect, a plasma supply system generates an output power greater than 500 W at an essentially constant basic frequency of greater than 3 MHZ for powering a plasma process. The plasma supply system includes at least two plasma supply devices, where each plasma supply device includes at least one inverter connected to a DC power supply, the at least one inverter has at least one switching element, and at least one output network is electrically coupled to the at least one inverter, where the at least one output network is arranged on a printed circuit board; and at least one coupler that combines output powers of the at least two plasma supply devices. In some examples, the plasma supply device generates an output power greater than 500 W at an essentially constant basic frequency in the range of 3 MHz to 30 MHz.

In other general aspect, a plasma supply device is driven for generating an output power greater than 500 W at an essentially constant basic frequency of greater than 3 MHz and for powering a plasma process, to which the generated output power is supplied, and from which reflected power is returned to the plasma supply device. At least one inverter connected to a DC power supply is driven, where driving the at least one inverter is done by driving at least one switching element. The power from the inverter is directed to at least one output network. The at least one output network includes at least one inductance that has at least one magnetic field strengthening element that is a Perminvar ferrite. The current through the inductance is limited so that the magnetic field strength H in the Perminvar ferrite is less than 50% of the coercive field strength $H_C$ of the Perminvar ferrite. In some examples, the plasma device generates an output power greater than 500 W at an essentially constant basic frequency of less than 30 MHz. In some examples, the plasma supply device generates an output power greater than 500 W at an essentially constant basic frequency in the range of 3 MHz to 30 MHz.

In one general aspect, a plasma supply device includes at least one output network that is arranged on a printed circuit board (PCB). This measure enables the output network to be produced extremely cheaply. It is also possible to produce the components of the output network with exact inductances and capacitances, i.e., inductance and capacitance values that in any case deviate slightly from theoretical values. This is possible with high repetition accuracy. Furthermore, at least one input connection can be arranged on the printed circuit board (PCB) for connecting at least one inverter and/or at least one inverter can be arranged on the printed circuit board. The output network has a considerable influence on reliability and consequently on the life time of the entire plasma power supply or plasma supply device. At least one component of the plasma supply device can be designed so that it at least partially absorbs power reflected by the plasma process at the basic frequency. Here the reflected power can be converted to heat. The reflected power can be absorbed at least partially by the inverter, by lossy inductances, transmitters, capacitances, or resistances.

In the case of the plasma supply device, the output network is dimensioned so that the area of the printed circuit board (PCB) can be kept smaller than 150 cm². The thickness of the printed circuit board (PCB) is typically 2 to 5 mm. Glass fiber reinforced epoxy resin, for example, FR4 or FR5 material, can be used as the printed circuit board (PCB) material. These materials are sufficient for this circuit, although they have a more lossy electric behavior and lower thermal conductivity and heat resistance than comparatively much more expensive ceramics or PTFE materials. Multi-layer circuit boards with flat designed inductances and surface mount device (SMD) components are known for lower frequency and power ranges. Contrary to the opinion that the materials used for the printed circuit boards of prior art are unsuitable for high frequency applications with an output power >500 W and a basic frequency >3 MHz, due to high heat development and bad power heat discharge, it is proposed to create an output network with planar inductances and capacitances on a printed circuit board (PCB) for the output power and high frequency range mentioned. This results in considerable savings in terms of space requirement and cost, and in improved accuracy and reproducibility in the production of the plasma supply device.

In this description, the terms inductance or capacitance and capacitor respectively are used for a component arranged on the printed circuit board (PCB) on the one hand, and for a physical value assigned to the component on the other, the corresponding application being evident from the context.

In one design of the plasma supply device, the at least one output network has at least one output transformer with a primary-side winding and a secondary-side winding. A galvanic separation is made by the output transformer between the at least one inverter connected to a DC power supply and a load, for example, a plasma load, to be connected to the printed circuit board. In this manner, low frequency signals, in particular, DC components that can be present at the output of the inverter, are separated. For the galvanic separation, a capacitance can alternatively be used. Due to the formation of adequate safe distances, the primary side of the output transformer can remain galvanically connected to the mains connection (that is, the supply voltage connection). Because a galvanic separation is correspondingly dispensed with in the DC power supply, the costs and overall size of the plasma supply device can be further reduced.

The output transformer can be designed in planar technology. Such an output transformer, produced in this manner and arranged on the printed circuit board, can be manufactured very precisely, and the turns of the primary- and secondary-side winding can be produced with good reproducibility. Moreover, this is cheaper than a construction with wire windings. Furthermore, the output transformer can be constructed with a large area and hence can be easily cooled.

In a further embodiment, the printed circuit board (PCB) is of a multi-layer design, in particular, with four layers, and one turn of the output transformer is formed in each layer of the printed circuit board. This provides the advantage that the capacitive coupling between the turns, which is normally considered to be an undesirable, parasitic capacitance, can be used for further switching parts, e.g., for an impedance adapter element. In addition, the stray inductances of the output transformer can also be used for other switching parts.

In one embodiment, the primary-side winding and the secondary-side winding of the output transformer each have two turns. All four layers of the printed circuit board (PCB) can therefore be used. The magnetic coupling and the stray inductance simultaneously generated can form an LC filter, for example.

In one embodiment of the plasma supply device, the output network has at least one set of first inductances arranged between the input connection and the primary-side winding. "Set of first inductances" is understood to mean that each inverter is connected by a first inductance to the output transformer assigned to it. The first inductances can be designed as planar conductor paths, each of which has one turn. The first inductances are suitably coupled magnetically, which means that magnetic field strengthening elements can be dispensed with. However, additional magnetic field strengthening elements can increase the inductance even further. Inductances ranging from 50 to 300 nH are obtained. The inductances can have values higher than 50 nH and qualities (that is, quality factors) better than 200. In one embodiment, conductor paths may be guided in parallel in several layers, for the first inductances, for example. The current is distributed to conductor paths and the losses are smaller. This improves the quality of the inductances to values greater than 200, which was not previously achieved with planar inductances ranging from 50 to 300 nH on only one layer.

The inverter circuit of the plasma supply device can have two half bridges each of which is connected to the DC power supply. By connecting the centers of the half bridge circuit by means of the first inductances to the primary-side winding of the output transformer, a low loss no-volt connection over a wide range of load impedances can be achieved. Advantageous switching conditions can be guaranteed for the inverter by means of the plasma supply device. For example, a no-volt connection is advantageous, particularly at higher frequencies and in the case of MOSFETs, or a no-current disconnection is advantageous, particularly at low frequencies and in the case of insulated-gate bipolar transistors (IGBTs) as switches in the inverter. This can be achieved by suitable dimensioning of the output network and the switching parts of the output network.

The distance between at least two layers of the printed circuit board (PCB) can be considerably greater than the distance required for the electric strength of the two layers.

In one embodiment of the plasma supply device, the capacitance formed by the conductor paths between the turns of the secondary-side winding of the at least one output transformer, together with the inductance of the secondary-side winding of the at least one output transformer, forms an LC filter. The capacitance formed by the conductor paths between the primary-side winding and the secondary-side winding of the at least one output transformer can be another component of the LC filter.

In one design, the output network can have an impedance adapter element between the secondary-side winding and an output connection for the connection to a load, with one or a plurality of second inductances and/or one or a plurality of capacitors. A load impedance adapter element is achieved in this manner from the inverter to the output of the output network. The power components reflected and/or generated by a plasma load are filtered by reactive components of the output network, i.e., inductances and capacitances.

Furthermore, the output network can have an LC filter. A signal with a relatively high proportion of harmonics or harmonic frequencies is generally transmitted to the output of the inverter, which frequencies are undesirable at the output of the plasma power supply, i.e., at the output connection. The plasma supply device filters these harmonics or harmonic frequencies by means of the LC filter. The stray inductance and the capacitance between two turns of the output transformer form an LC filter, thus dispensing with additional components. The LC filter is either designed as described above and/or is part of the impedance adapter element. In a further embodiment, the output network has an SMD capacitor parallel to the secondary-side winding. The capacitance between the secondary-side turns can then reinforce the capacitance of this capacitor.

Furthermore, the second inductance or inductances can be designed in planar technology. The capacitor or capacitors can, for example, be designed in planar technology and/or as an SMD component. This provides the advantage of improved accuracy and reproducibility in the production of the plasma supply device.

The printed circuit boards can have through contacts for connecting the conductor paths arranged in layers. High strength of the printed circuit board (PCB) and good contacts between the switching parts arranged on it are therefore guaranteed. Both the input connection for connecting the DC power supply or the inverter and the output connection for connecting the plasma load, to which the sinusoidal output signal generated by the output network is transmitted, can be connected to through contacts. No such through contacts could be provided on printed circuit boards from the state of the art, which for reasons of thermal conductivity have been mounted directly on the cooling plate, because they would have caused a short-circuit between the cooling plate lying on an earth potential and the potentials of the through contacts.

In one design of the plasma supply device, at least one magnetic field strengthening element assigned to one or a plurality of inductances and/or windings of the output transformer, is provided on the printed circuit board. This enables the number of turns for the individual inductances to be reduced. It is therefore possible to achieve high inductances with short conductor paths. Because of the short conductor paths, there is the added advantage of low resistances and correspondingly lower losses.

A magnetic field B is caused by a magnetic field strength H, which is in turn caused by a current I through a cable that forms an inductance. There is a relation $B=\mu*H$ between B and H, where $\mu$ is the permeability. The permeability $\mu$ is composed of the permeability of the vacuum $\mu_0=4\pi*10^{-7}$ Vs/Am and the permeability coefficient $\mu_r$, which is material-dependent: $\mu=\mu_0*\mu_r$. A magnetic field strengthening element has a $\mu_r$ that is far greater than 1. Typically a ferrite is used as the magnetic field strengthening element at the frequencies mentioned. In the case of inductances the magnetic field strengthening element increases the value of the inductance according to the permeability coefficient $\mu_r$.

In one embodiment, the at least one magnetic field strengthening element can be a ferrite, in particular, a Perminvar ferrite. Typically the magnetic field strengthening elements or ferrites enclose the conductor paths of the planar inductances in an annular manner. The ferrites that enclose the turns of the inductances or windings in an annular or shell manner suitably consist of two parts that are arranged on the printed circuit board (PCB) on a counterpart basis.

Furthermore, at least one recess can be formed on the printed circuit board (PCB) for receiving the at least one magnetic field strengthening element. Recesses are typically formed on the printed circuit board (PCB) for receiving the magnetic field strengthening element consisting in two parts of two identical or at least similar parts. The magnetic field strengthening element can in this way be arranged safely on the printed circuit board (PCB) so that space is saved.

In one embodiment, the plasma supply device has a cooling plate connected to the printed circuit board. In one design, coolant flows through the cooling plate, thus providing a plasma power supply without forced air flow, i.e., without fans. In one design the cooling plate is connected to an earth potential, which ensures good electrical screening of the output network.

A distance of 1 µm/V is normally required for sufficient electric strength as a function of the maximum voltage that can be generated between the conductor paths of two layers of the circuit board. To prevent excessive heat development when operating the plasma supply device, a greater minimum distance between the conductor paths is proposed between two layers, since the electric losses are reduced with this extended minimum distance. This greater minimum distance is typically 10 µm/V. In one design the printed circuit board (PCB) can be arranged separated from the cooling plate, in particular by a distance of 5 mm to 20 mm. The inductances can then be provided with a better quality and low losses.

In one design the output network can be arranged at such a distance from the cooling plate, where the distance is related to the thickness of the magnetic field strengthening element enclosing the inductance(s) and/or the windings of the output transformer. The magnetic field strengthening elements can enclose the inductances in a rectangular/annular shape and placed flat on the cooling plate, possibly for mechanical load relief with elastic heat transmission elements between the cooling plate and the magnetic strengthening elements. This ensures good heat discharge of the heat developed in the magnetic field strengthening elements. The construction of an output network with the extremely low cost multi-layer FR4 or FR5 material and with through contacts was not possible until the opinion that the entire printed circuit board (PCB) provided with planar inductances must lie laminar in contact with the cooling plate was departed from.

In one design, one or a plurality of electrically insulating heat transmission elements are arranged between the printed circuit board (PCB) and the cooling plate. The heat is discharged from the printed (PCB) to the cooling plate by means of the heat transmission elements, which are also suitably of an elastic design. The heat is discharged from the points on the printed circuit board (PCB) at which a strong heat development takes place, for example, in the region of the output transformer, by means of flat copper conductor paths, to points where there is less heat development. The heat transmission elements can be arranged in the vicinity of the output transformer, and conductor paths can be guided through the magnetic field strengthening element assigned to the output transformer to the heat transmission elements. Electrically insulating heat transmission elements of a flat design can be arranged in the region of an enclosing magnetic field strengthening element, such as a ferrite, i.e., in the region of high currents. The warmth or heat is expelled as far as possible from the region of the magnetic field strengthening element by means of the copper conductor paths, and is discharged further from there to the cooling plate.

An earth connection can be provided on the circuit board. The earth connection can be designed as a contacted bore. Spacer bolts can be provided between the printed circuit board (PCB) and the cooling plate, to which bolts an earth connection can be made.

The upper power limit of the plasma supply device is determined, among other things, by the dissipation to be discharged. The upper power limit can be increased if the plasma supply device has at least two output networks on a printed circuit board (PCB), and the two output networks together can be fed by at least one inverter connected to the DC power supply or can be individually fed by at least one inverter connected to the DC power supply, and if their output powers can be combined by at least one coupler to generate one total power. A coupler is an electronic component that is designed to combine or split electrical powers. The coupler can also have components that at least partially absorb the reflected power.

The upper power limit can be further increased if at least one output network of the plasma supply device has at least two sets of first inductances and/or at least two output transformers and/or at least two impedance adapter elements whose input and output powers are each split by at least one coupler or combined to form one total power.

The at least one coupler required in these cases can be arranged on a printed circuit board (PCB) and can preferably be designed at least partially in planar technology.

In a plasma supply arrangement the output powers are combined by at least two plasma supply devices by at least one coupler.

Further features and advantages of the invention are evident from the following description of exemplary embodiments of the invention, with reference to the figures in the drawing, which show the details according to the invention, and from the claims. The individual features may be implemented individually or several features may be combined in a variant of the invention.

Preferred exemplary embodiments of the invention are represented diagrammatically in the drawing and are explained in greater detail in the following with reference to the figures in the drawing.

DETAILED DESCRIPTION

Figure 1:
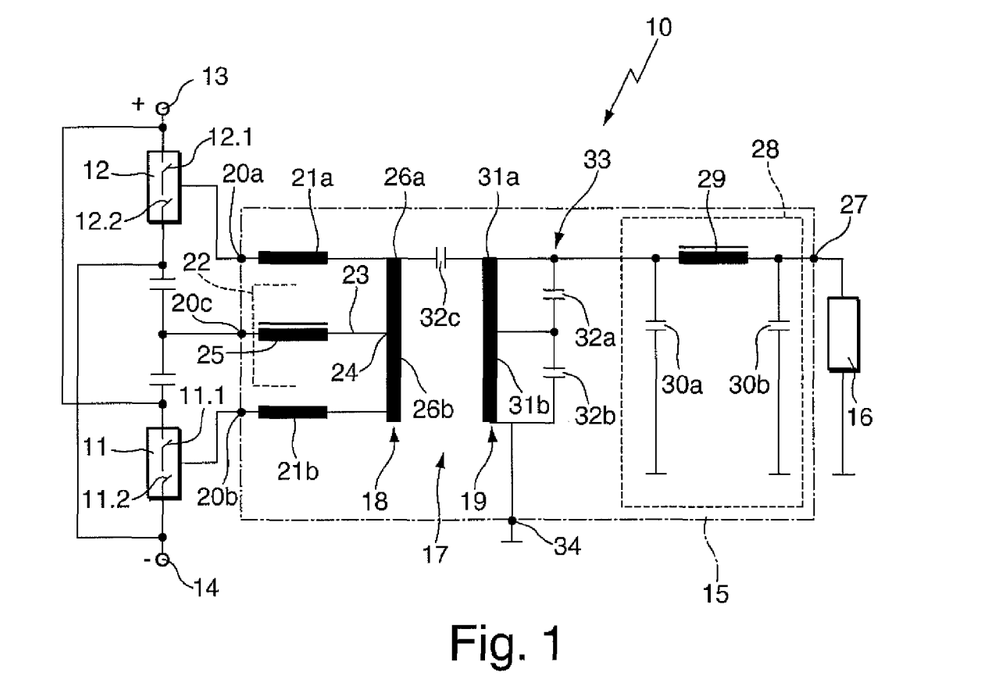
FIG. 1 shows a simplified circuit diagram of a plasma supply device including an output network.

FIG. 1 shows a plasma supply device 10 having a first inverter 11 and a second inverter 12. The inverters 11, 12 are designed as half bridges, each with two series-connected switching elements 11.1, 11.2, 12.1, 12.2. Both inverters 11, 12 are connected to a positive supply voltage connection 13 and a negative supply voltage connection 14 of a DC power supply (not shown). Plasma supply device 10 also has an output network 15 to which inverters 11, 12 on one side, and a load 16, for example, a plasma load, on the other side, are connected. Acting as a key part of the plasma supply device 10, the output network 15 includes an output transformer 17 with a primary-side winding 18 and a secondary-side winding 19.

The output network 15 includes first inductances 21a, 21b arranged between input connections 20a, 20b from respective inverters 12, 11 and the primary-side winding 18 of the output transformer 17. The first inductances 21a, 21b are coupled together magnetically (as denoted by dotted line 22) because of their mutual spatial arrangement on a printed circuit board (PCB) (not shown in FIG. 1). A higher output power can be achieved by means of the plasma supply device 10 by connecting together outputs of the two inverters 11, 12 that are fed respectively through the input connections 20a, 20b with the primary-side winding 18. A central tapping 24 is provided on the primary-side winding 18 by means of a further connecting cable 23, another inductance 25 being provided in further connecting cable 23, which inductance is connected to an input connection 20c, which is connected to the connection point of inverters 11, 12. The primary-side winding 18 has two primary-side turns 26a, 26b, which are arranged on both sides of central tapping 24.

An impedance adapter element 28 is arranged between the secondary-side winding 19 and an output connection 27 for the load 16. Impedance adapter element 28 includes a second inductance 29 and two capacitors 30a, 30b. The impedance adapter element 28 can have a plurality of second inductances 29 in series with the load 16 and capacitors 30a, 30b in parallel with the load 16. The secondary-side winding 19 also has two secondary-side turns 31a, 31b. An alternating current signal transmitted to input connections 20a, 20b is generated in the form of a sinusoidal output signal transmitted to the output connection 27 by means of the output network 15. Furthermore, harmonic frequencies are filtered and DC proportions separated.

The output transformer 17 is designed with a planar technology in that primary- and secondary-side turns 26a, 26b, 31a, 31b lie flat one above the other. Planar technology means that inductances are like tracks on the PCB or several layers of the PCB and can be curled or helical to enhance the inductivity. There are capacitances in the form of capacitors 32a, 32b, 32c between the turns 26a, 26b, 31a, 31b of the output transformer 17. The capacitors 32a, 32b, 32c and the turns 31a, 31b of the secondary-side winding 19 are components of an LC filter 33. Furthermore, an earth connection 34 connected to the secondary-side winding 19 is provided. The other inductance 25 and the second inductance 29 each have a magnetic field strengthening element in the form of a Perminvar ferrite. The output network 15 is designed primarily with a planar technology and is arranged on a multi-layer circuit board, including the input connections 20a, 20b, 20c, the earth connection 34, and the output connection 27.

Figure 2:
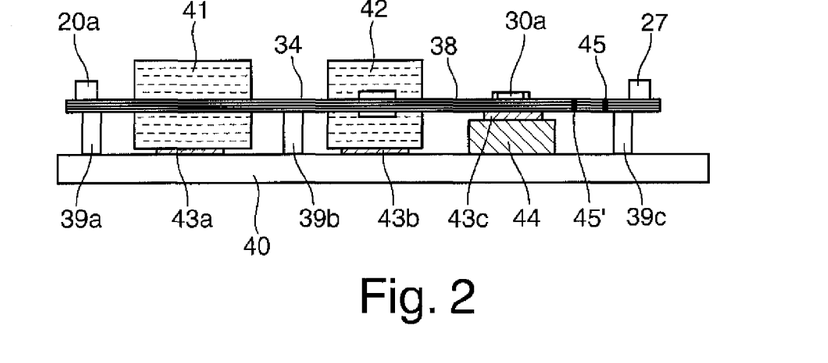
FIG. 2 shows a section through a printed circuit board (PCB) with an output network arranged on it and through a cooling plate connected to the printed circuit board.

FIG. 2 shows a vertical section through a horizontally arranged multi-layer printed circuit board (PCB) 38. The printed circuit board (PCB) 38 is constructed as a so-called multi-layer printed circuit board. The printed circuit board (PCB) 38 is separated from and connected to a cooling plate 40 by means of spacer bolts 39a, 39b, 39c. The output network 15 including the input connections 20a, 20b and the output connection 27 are arranged on or in the printed circuit board (PCB) 38, where the input connections 20a, 20b connect to the inverters 11, 12 and the output connection 27 connects to the load 16. A first magnetic field strengthening element 41 is arranged in the region of the first inductances 21a, 21b, and a second magnetic field strengthening element 42 is arranged in the region of the output transformer 17, where the magnetic field strengthening elements 41, 42 are each composed of two parts arranged on both sides of the printed circuit board (PCB) 38. The capacitors 30a, 30b of the impedance adapter element 28 are designed as surface mount device (SMD) components.

Elastic, flat designed heat transmission elements 43a, 43b, 43c are arranged between the printed circuit board (PCB) 38 and the cooling plate 40 in the region or vicinity of the inductances 18, 19, 21a, 21b, 29 of the output network 15. For example, the elements 41, 42 surround the inductances 21a, 21b and the output transformer 17 and also touch the heat transmission elements 43a and 43b to provide an indirect thermal coupling between the elements 43a, 43b and the inductances 21a, 21b and the transformer 17. And, another heat transmission element 44 designed as a copper block is provided in the region of the impedance adapter element 28 to provide an indirect thermal coupling between the inductance 29 and the heat transmission element 44. The heat generated during operation of the plasma supply device 10 in the region of inductances 18, 19, 21a, 21b, 29 is discharged from the printed circuit board (PCB) 38 to the cooling plate 40 by means of the heat transmission elements 43a, 43b, 43c, 44. For improved heat discharge, the magnetic field strengthening elements 41, 42 can be surrounded, region by region, by a heat conducting compound, for example, a heating conducting foam. The output network 15 is designed in planar technology with conductor paths in the multilayer printed circuit board (PCB) 38. Through contacts 45 and 45', for example, are formed in the printed circuit board (PCB) 38 for connecting the conductor paths of different layers.

Figure 3A:
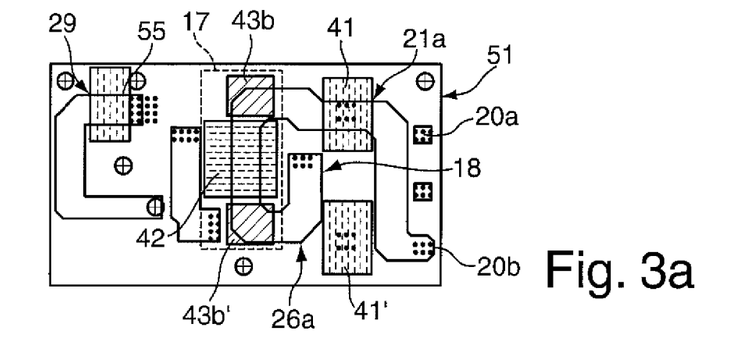
FIGS. 3a to 3d each show one layer of the printed circuit board (PCB) of FIG. 2.
Figure 3B:
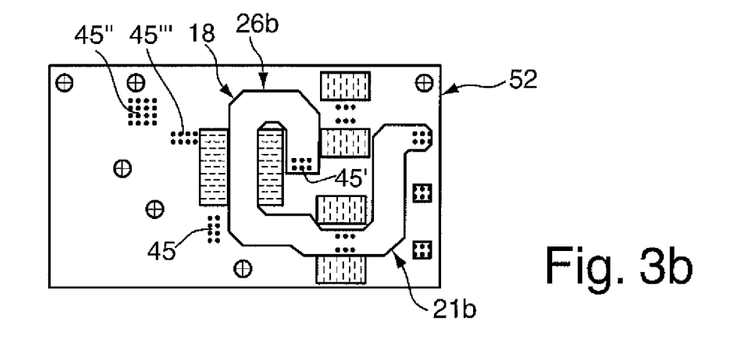
Figure 3C:
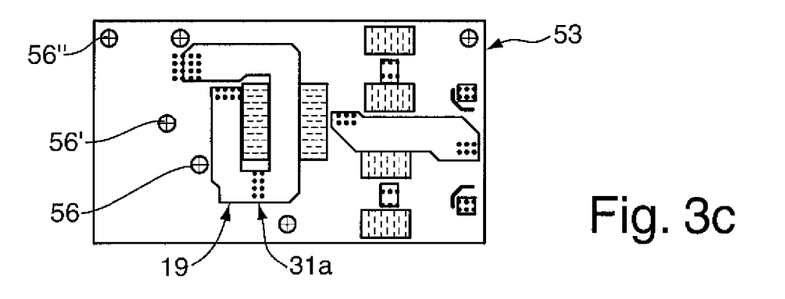
Figure 3D:
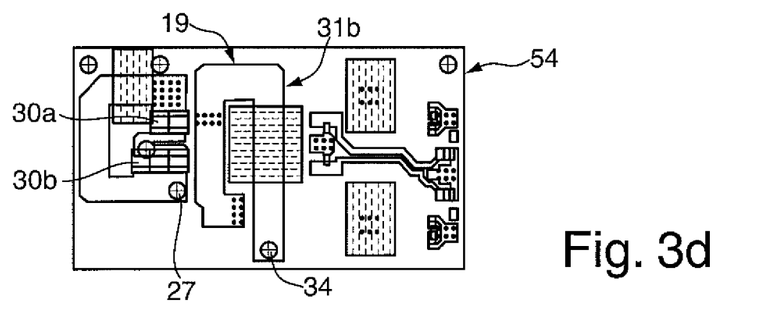

FIGS. 3a to 3d show the different layers of the printed circuit board (PCB) 38, namely a lower layer 51 (FIG. 3a), a first inner layer 52 (FIG. 3b), a second inner layer 53 (FIG. 3c), and an upper layer 54 (FIG. 3d). Magnetic field strengthening elements 41, 41', and 42 are arranged in the region of the first inductances 21a, 21b and in the region of inductances 18, 19 of the output transformer 17 with turns 26a, 26b, 31a, 31b. In addition, a third magnetic field strengthening element 55 is provided in the region of impedance adapter element 28. Adjacent to through contacts 45, 45', 45'', 45''', bores 56, 56', 56'' are formed between the layers 51, 52, 53, 54, thus ensuring good contacts between the conductor paths and a high strength of the printed circuit board (PCB) 38. Adjacent to the input connections 20a, 20b and the output connection 27, the earth connection 34 is arranged on the printed circuit board (PCB) 38. The capacitors 30a, 30b of the impedance adapter element 28, designed as SMD components, are arranged on the upper layer 54. A possible layer of the heat transmission elements 43b, 43b' is drawn in FIG. 3a. In the output transformer 17, a high current flows through all four layers 51, 52, 53, 54 of the printed circuit board (PCB) 38. The highest heat development therefore takes place here. This heat cannot be discharged sufficiently to cooling plate 40 inside the magnetic field strengthening element 42 formed as ferrite. Therefore the heat is expelled from the region of magnetic field strengthening element 42 through the conductor paths formed in copper, and is discharged through the heat transmission elements 43b, 43b' to the cooling plate 40.

Figure 4:
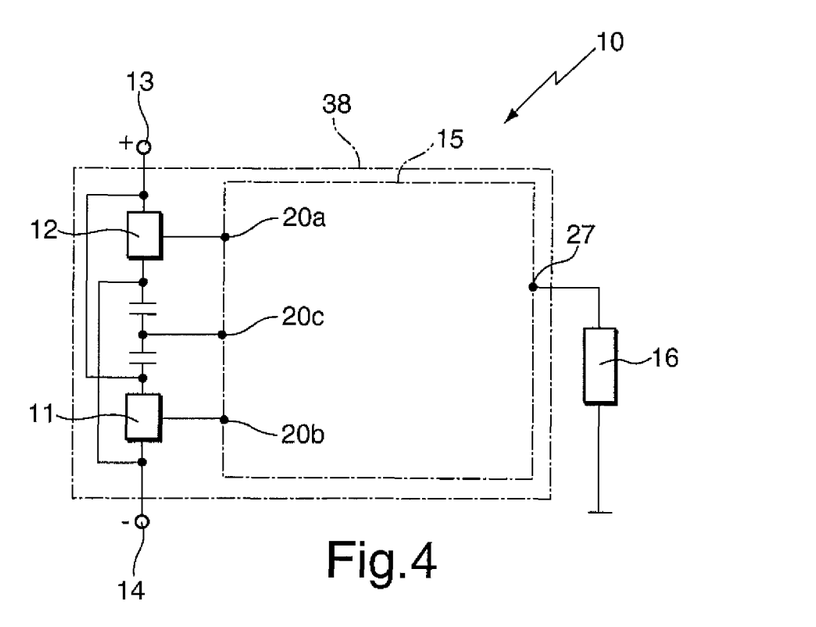
FIG. 4 shows a simplified circuit diagram of another plasma supply device.

FIG. 4 shows the plasma supply device 10 with the inverters 11, 12 connected to supply voltage connections 13, 14 of a DC power supply and with the output network 15. The output network 15 includes the input connections 20a, 20b for the input signal generated by respective inverters 12, 11, the input connection 20c for the central tapping, and the output connection 27 for the connection of the load 16. The inverters 11, 12, just as the output network 15, the input connections 20a, 20b, 20c, and the output connection 27, are arranged on the printed circuit board (PCB) 38.

Figure 5A:
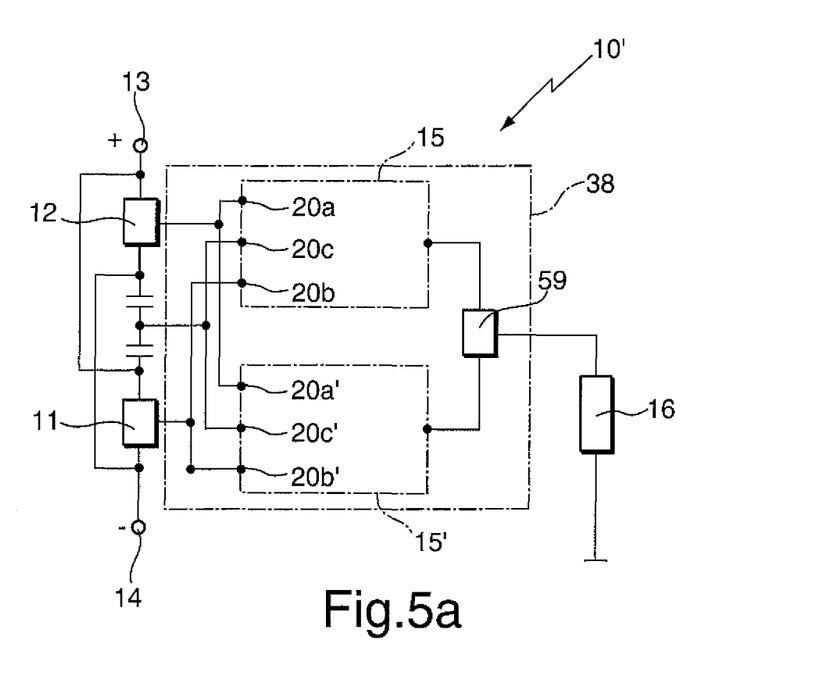
FIGS. 5a and 5b each show a simplified circuit diagram of an exemplary plasma supply device having two output networks.
Figure 5B:
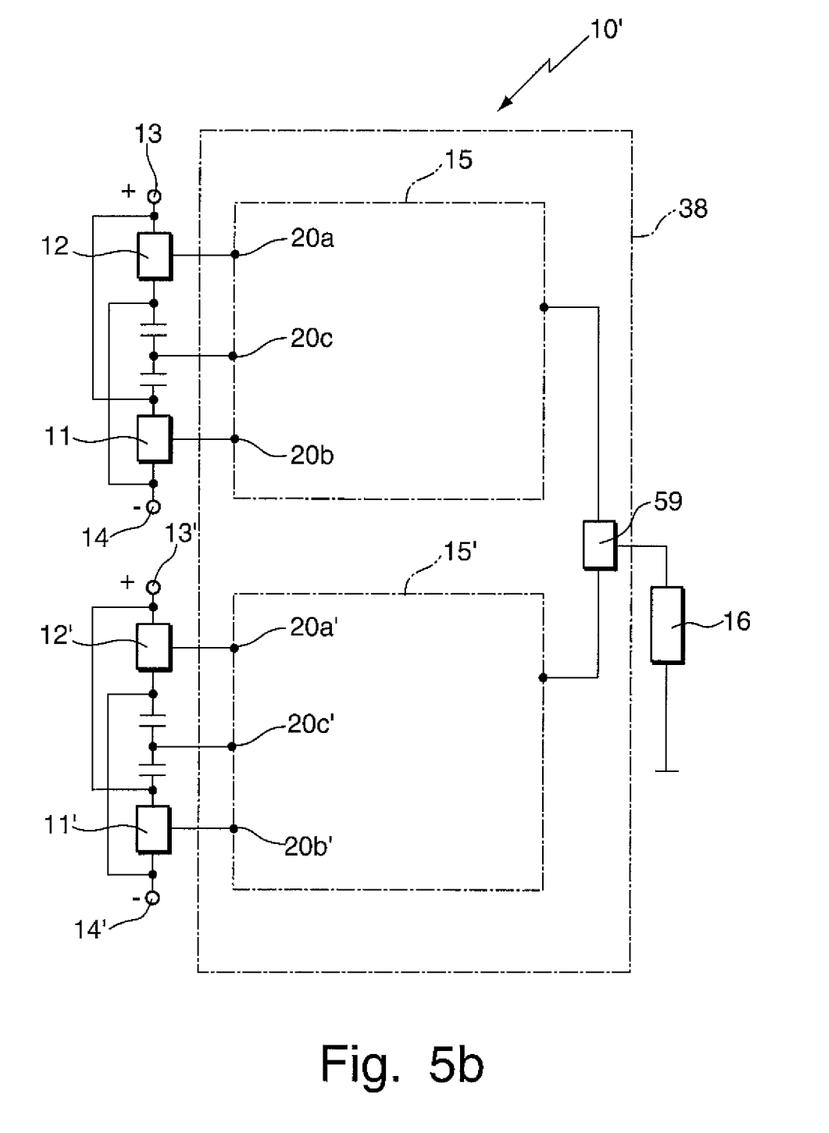

FIGS. 5a and 5b each show a plasma supply device 10' with the output network 15 and another output network 15'. Each of the output networks 15, 15' have three input connections 20a, 20b, 20c and 20a', 20b', 20c', respectively. In FIG. 5a, both output networks 15, 15' are connected in parallel to inverters 11, 12 and to DC power supply 13, 14. The plasma supply device 10' shown in FIG. 5b is different in that the other output network 15' is connected by additional inverters 11', 12' to additional supply voltage connections 13', 14' of another independent DC power supply. The output signals of both of the output networks 15, 15' are combined by means of a coupler 59 and are transmitted to the load 16. The output networks 15, 15', including the coupler 59, are arranged on the printed circuit board (PCB) 38. It is also conceivable for the inverters 11, 12, 11', 12' to be arranged on the printed circuit board (PCB) 38. It is also conceivable for the coupler 59 to be arranged outside the printed circuit board, and it is also possible for the output networks to be provided on separate printed circuit boards with or without inverters.

Figure 6:
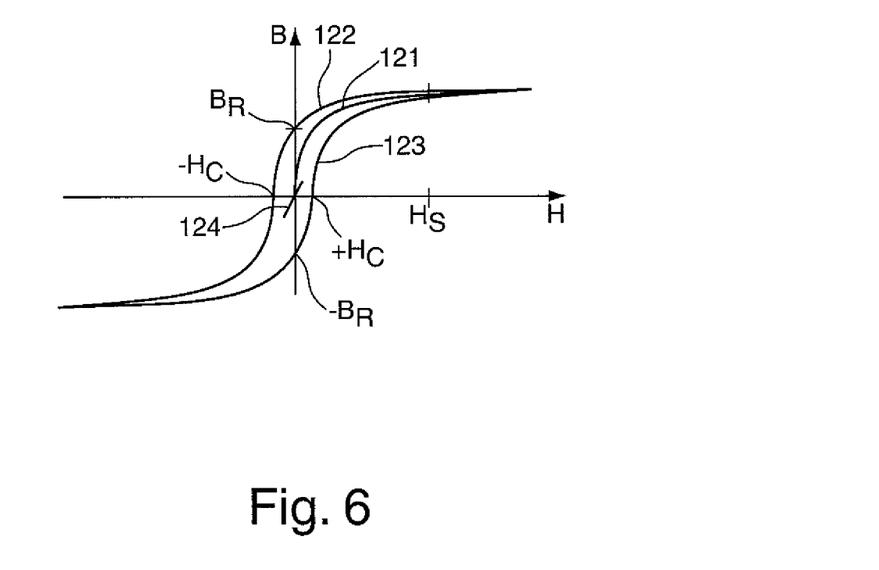
FIG. 6 is a graph showing a hysteresis of an Perminvar ferrite with its range of use.

The output network 15 or 15' includes at least one inductance that has at least one magnetic field strengthening element that is a Perminvar ferrite. FIG. 6 shows a magnetic hysteresis loop that shows a behavior of ferromagnetic material like iron, cobalt, or nickel. In FIG. 6, the magnetic flux density B of a Perminvar ferrite is plotted versus the magnetizing field strength H. Normal process of magnetization begins at the cross where H and B are zero. When the field strength H rises due to a rise of current in the inductance then the magnetic flux density B rises, but in a nonlinear way; initially, very steep and then slower and slower as shown in curve 121. After reaching the field strength $H_C$, then if the field strength H decreases due to a decrease of the current, the magnetic flux density B also decreases but along a different curve 122 than the curve 121 (when the field strength H was rising). As the current reaches zero and therefore also the field strength H reaches zero, there is still remaining residual magnetism $B_R$. If the current then becomes negative, and therefore also the field strength H becomes negative, the magnetic flux density B reaches zero when the field strength H has reached the coercive field strength $H_C$. Thus, the coercive field strength is the field strength $H_C$ at which the magnetic flux density B is zero. The behavior can be seen in curve 123 when the current and the field strength H rise again after reaching the coercive field strength $H_C$. When the current through the inductance is a alternating current, then the flux density B behaves like the curves 122 and 123. This hysteresis behavior generates losses and should be avoided.

Therefore, usage of ferrite material with low hysteresis behavior are preferred for high frequency power supplies. Perminvar ferrites are made of cobalt nickel and iron, and have a very strong hysteresis behavior and are therefore usually not used in the frequency range of 3 MHz to 200 MHz and in the power range above 500 W or 1 kW. However, there is a range in the hysteresis curve of Perminvar ferrites in which the losses are much lower than expected. If the magnetizing force (field strength) H is kept under a specific value and within this range, then the hysteresis behavior and the losses are much lower. Curve 124 in FIG. 6 shows this range of the hysteresis curve. The full possibilities of the material to strengthen the inductance are intentionally not used and in this range, the flux density B and the field strength H are kept in a nearly linear range and the losses are reduced. In particular, the current through the Perminvar ferrite is limited so that the field strength H is under 50% of the coercive field strength $H_C$ or under 1000 A/m. In this way, Perminvar ferrites can be used in a plasma supply device that operates at a high frequency, for example, greater than 3 MHz, and at powers above 500 W such as the plasma supply device 10. In some implementations, the basic frequency is in the range of 3 MHz to 30 MHz.

Other implementations are within the scope of the following claims.

What is claimed is:

1. A plasma supply device comprising:
    an inverter connected to a DC power supply, wherein the inverter has at least one switching element, and wherein the inverter is configured to convert DC power from the DC power supply into AC power greater than 500 W at an essentially constant basic frequency greater than 3 MHz; and
    an output network comprising an input and an output, the input being electrically coupled to the inverter, the output being electrically coupled to a plasma load, wherein the output network is configured to provide the AC power from the inverter to the plasma load and filter reflected power that is returned from the plasma load, and wherein the output network includes a transformer comprising primary and secondary windings, and the capacitance formed by one or more conductor paths between one or more turns of the secondary winding of the transformer, together with the inductance of the secondary winding, forms an LC filter of the output network;
    wherein the output network includes an inductance that has a magnetic field strengthening element that is a Perminvar ferrite, and wherein the magnetic field strengthening element encloses the inductance.

2. The plasma supply device of claim 1, wherein the output network is arranged on a printed circuit board and the inductance is formed using a planar technology.

3. The plasma supply device of claim 2, wherein the printed circuit board is produced from glass fiber reinforced epoxy resin.

4. The plasma supply device of claim 2, wherein the printed circuit board defines a recess configured to receive the magnetic field strengthening element.

5. The plasma supply device of claim 2, further comprising a cooling plate connected to the printed circuit board.

6. The plasma supply device of claim 5, wherein the magnetic field strengthening element encloses a winding of an output transformer, and wherein the printed circuit board is separated from the cooling plate by a distance that is greater than or equal to a thickness of the magnetic field strengthening element.

7. The plasma supply device of claim 5, further comprising a heat transmission element disposed between the printed circuit board and the cooling plate.

8. The plasma supply device of claim 7, wherein the heat transmission element is in the vicinity of an output transformer, and wherein a conductor path of the printed circuit board extends to the heat transmission element through a magnetic field strengthening element associated with the output transformer.

9. The plasma supply device of claim 1, wherein the inductance is part of an output transformer having a primary-side winding and a secondary-side winding.

10. The plasma supply device of claim 9, wherein the magnetic field strengthening element is associated with one or more windings of the output transformer.

11. The plasma supply device of claim 1, wherein the inductance has a value greater than 50 nH and a quality factor better than 200.

12. The plasma supply device of claim 1, wherein the output network is a first output network, the device further comprising a second output network having a power output coupled to a power output of the first output network by a coupler so as to provide a combined power output.

13. The plasma supply device of claim 12, wherein the coupler is disposed on a printed circuit board and is designed at least partially in a planar technology.

14. The plasma supply device of claim 12, wherein the coupler includes an inductance having a magnetic field strengthening element that is a Perminvar ferrite.

15. The plasma supply device of claim 14, wherein the magnetic field strengthening element of the coupler has the same shape as the magnetic field strengthening element of the inductance of the first output network.

16. The plasma supply device of claim 14, wherein the at least one magnetic field strengthening element of the coupler is made of the same material as the magnetic field strengthening element of the inductance of the first output network.

17. The plasma supply device of claim 1, configured to operate at an essentially constant basic frequency of less than 30 MHz.

18. The plasma supply device of claim 1, the output network comprising first and second inductances electrically coupled between the inverter and a transformer, the output network further comprising a first capacitance electrically coupled to the transformer.

19. A method comprising:
driving an inverter connected to a DC power supply, by driving at least one switching element, wherein the driving includes converting DC power from the DC power supply into AC power greater than 500 W at an essentially constant basic frequency greater than 3 MHz; and
directing power from the inverter to an output network comprising an input and an output, the input being electrically coupled to the inverter, the output being electrically coupled to the plasma load, wherein directing power includes providing by the output network the AC power from the inverter to the plasma load and filtering by the output network reflected power that is returned from the plasma load, wherein the output network includes a transformer comprising primary and secondary windings, and the capacitance formed by one or more conductor paths between one or more turns of the secondary winding of the transformer, together with the inductance of the secondary winding, forms an LC filter of the output network
wherein the output network includes at least one inductance that has a magnetic field strengthening element that is a Perminvar ferrite, and wherein the magnetic field strengthening element encloses the inductance, and
wherein current through the inductance is limited so that magnetic field strength in the Perminvar ferrite is less than 50 percent of the coercive field strength of the Perminvar ferrite.

20. The method of claim 19, comprising operating the plasma supply device at an essentially constant basic frequency of less than 30 MHz.

* * * * *